(12) United States Patent
Anderl et al.

(10) Patent No.: US 10,002,819 B2
(45) Date of Patent: Jun. 19, 2018

(54) HEAT SINK WITH INTEGRATED THREADED LID

(71) Applicant: International Business Machines Corporation, Armonk, NY (US)

(72) Inventors: William J. Anderl, Rochester, MN (US); Bret P. Elison, Rochester, MN (US); Phillip V. Mann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 15/076,986

(22) Filed: Mar. 22, 2016

(65) Prior Publication Data

US 2017/0229374 A1 Aug. 10, 2017

Related U.S. Application Data

(63) Continuation of application No. 15/040,024, filed on Feb. 10, 2016, now Pat. No. 9,736,966.

(51) Int. Cl.
*H05K 7/20* (2006.01)
*B23P 11/00* (2006.01)
(Continued)

(52) U.S. Cl.
CPC ............ *H01L 23/4006* (2013.01); *G06F 1/20* (2013.01); *H01L 21/4882* (2013.01);
(Continued)

(58) Field of Classification Search
CPC ..... H01L 23/34; H01L 23/36; H01L 23/3675; H01L 2023/405; H01L 2023/4087;
(Continued)

(56) References Cited

U.S. PATENT DOCUMENTS

| 3,229,756 A | 1/1966 | Keresztury |
| 4,047,198 A * | 9/1977 | Sekhon ................... H01L 23/42 165/104.26 |

(Continued)

FOREIGN PATENT DOCUMENTS

EP      1548827 A1    6/2005

OTHER PUBLICATIONS

U.S. Appl. No. 15/040,024 Non-Final Office Action dated Dec. 30, 2016.

(Continued)

*Primary Examiner* — Sarang Afzali
*Assistant Examiner* — Darrell C Ford
(74) *Attorney, Agent, or Firm* — Law Office of Jim Boice

(57) ABSTRACT

A method affixes a heat sink to a module lid. A module lid is mounted to a substrate by use of a lid adhesive. The module lid has a threaded exterior portion. The module lid is thermally interfaced to a die by use of a thermal interface material. The heat sink is then screwed onto a module lid, where the heat sink includes a threaded heat sink base pocket that mates with the threaded exterior portion of the module lid, and wherein the heat sink is screwed down onto the module lid until 1) a solid mechanical and thermal contact is established between the heat sink and the module lid, and 2) an airflow from an air moving device flows unobstructed across vanes on the heat sink.

2 Claims, 3 Drawing Sheets

(51) Int. Cl.
  *B23P 17/00* (2006.01)
  *B23P 15/26* (2006.01)
  *H01L 23/40* (2006.01)
  *G06F 1/20* (2006.01)
  *H01L 23/367* (2006.01)
  *H01L 21/48* (2006.01)
  *H01L 23/42* (2006.01)
  *H01L 23/00* (2006.01)

(52) U.S. Cl.
  CPC .......... *H01L 23/3675* (2013.01); *H01L 23/42* (2013.01); *H01L 24/16* (2013.01); *H01L 24/73* (2013.01); *H01L 2023/4037* (2013.01); *H01L 2023/4056* (2013.01); *H01L 2023/4062* (2013.01); *H01L 2023/4068* (2013.01); *H01L 2023/4087* (2013.01); *H01L 2224/16227* (2013.01); *H01L 2224/32245* (2013.01); *H01L 2224/73253* (2013.01); *H01L 2924/15174* (2013.01); *H01L 2924/15311* (2013.01); *H01L 2924/16152* (2013.01); *H01L 2924/16251* (2013.01)

(58) Field of Classification Search
  CPC ......... Y10T 29/49963; Y10T 29/49966; Y10T 29/53133; Y10T 29/49348; Y10T 29/49366; Y10T 29/53113; B29C 65/561; B29C 65/00; B29C 65/48; B29C 65/72; F16B 47/003; F16B 25/00; F16B 11/006; F16B 39/225; B21C 37/22; B21D 53/02; B23K 2201/14; B23P 15/26; B23P 2700/10; F02M 61/168; F28F 2275/20
  USPC ......... 361/709, 710; 29/525.11, 525.13, 726, 29/890.02, 890.039
  See application file for complete search history.

(56) References Cited

U.S. PATENT DOCUMENTS

| | | | |
|---|---|---|---|
| 4,345,267 A | 8/1982 | Corman | |
| 4,396,935 A | 8/1983 | Schuck | |
| 4,607,685 A * | 8/1986 | Mitchell, Jr. | H01L 23/4006 165/185 |
| 4,715,438 A * | 12/1987 | Gabuzda | H01L 23/3672 165/185 |
| 4,918,571 A | 4/1990 | Grabbe | |
| 5,256,902 A | 10/1993 | Culver | |
| 5,313,099 A | 5/1994 | Tata | |
| 5,353,193 A | 10/1994 | Chia | |
| 5,397,919 A | 3/1995 | Tata | |
| 5,566,052 A | 10/1996 | Hughes | |
| 5,579,827 A | 12/1996 | Chung | |
| 5,708,564 A | 1/1998 | Lin | |
| 5,774,335 A | 6/1998 | Pare | |
| 5,789,813 A * | 8/1998 | Kirkland | H01L 23/4093 257/712 |
| 5,815,921 A | 10/1998 | Burward-Hoy | |
| 6,021,045 A | 2/2000 | Johnson | |
| 6,252,774 B1 | 6/2001 | Rife | |
| 6,343,012 B1 | 1/2002 | Rife | |
| 6,385,044 B1 * | 5/2002 | Colbert | H01L 21/4882 165/104.34 |
| 6,549,407 B1 | 4/2003 | Sauciuc | |
| 6,665,187 B1 * | 12/2003 | Alcoe | H01L 23/10 165/185 |
| 6,695,042 B1 | 2/2004 | Bourdeaux | |
| 6,828,673 B2 | 12/2004 | Ficorilli | |
| 6,847,106 B1 | 1/2005 | Howard et al. | |
| 7,352,575 B2 | 4/2008 | Anderl | |
| 7,896,679 B2 | 3/2011 | Hsu et al. | |
| 7,905,276 B2 | 3/2011 | Clough | |
| 8,807,202 B2 | 8/2014 | Wang | |
| 2002/0041018 A1 * | 4/2002 | Ro | H01L 23/10 257/678 |
| 2005/0034841 A1 | 2/2005 | Barr et al. | |
| 2005/0207123 A1 | 9/2005 | Atkinson | |
| 2005/0265000 A1 | 12/2005 | He | |
| 2007/0035937 A1 * | 2/2007 | Colbert | H01L 23/4006 361/810 |
| 2009/0223647 A1 * | 9/2009 | Alousi | F28D 15/0233 165/80.3 |
| 2011/0168475 A1 * | 7/2011 | Moser | B60R 21/01 180/271 |
| 2014/0138811 A1 | 5/2014 | Pandey et al. | |
| 2014/0239488 A1 * | 8/2014 | Kobayashi | H01L 23/36 257/718 |
| 2014/0367847 A1 | 12/2014 | Strader et al. | |
| 2015/0049450 A1 * | 2/2015 | Okamoto | H01L 23/49816 361/779 |
| 2017/0231113 A1 * | 8/2017 | Anderl | G06F 1/20 |

OTHER PUBLICATIONS

Occhionero et al., "Aluminum Silicon Carbide (ALSIC) Microprocessor Lids and Heat Sinks for Integrated Thermal Management Solutions", IMAPS Denver 2000, Apr. 26-28, pp. 1-5, Denver CO.
List of IBM Patents or Patent Applications Treated as Related, Oct. 5, 2016, pp. 1-2.

* cited by examiner

CROSS SECTION A-A'

HEAT SINK WITH INTEGRATED THREADED LID

BACKGROUND

The present disclosure relates to the field of electronic circuits, and specifically to cooling devices used in electronic circuits. Still more specifically, the present invention relates to heat sinks used as cooling devices in electronic circuits.

SUMMARY

A method affixes a heat sink to a module lid. A module lid is mounted to a substrate by use of a lid adhesive. The module lid has a threaded exterior portion. The module lid is thermally interfaced to a die by use of a thermal interface material. The heat sink is then screwed onto a module lid, where the heat sink includes a threaded heat sink base pocket that mates with the threaded exterior portion of the module lid, and wherein the heat sink is screwed down onto the module lid until 1) a solid mechanical and thermal contact is established between the heat sink and the module lid, and 2) an airflow from an air moving device flows unobstructed across vanes on the heat sink.

DETAILED DESCRIPTION

Electronics cooling for packaged modules often uses two methods of mounting/mating their cooling solution: mounting hardware and adhesive thermal interface material (TIM). In the prior art, mounting hardware used clips, screws, springs, etc. that provided tensions between the cooling solution (e.g., a heat sink) and the device being cooled (e.g., an integrated circuit (IC), also known as a "die", which is a small block of semiconducting material on which a functional circuit is fabricated). The adhesive TIM provides thermal conduction between the heat sink and the die.

Mounting hardware poses several problems.

First, mounting hardware takes up high quality board space and is sometimes impossible to use on various modules. That is, springs, clips, etc. not only take up space in a system, they are also difficult to manipulate.

Second, mounting hardware is not adjustable. That is, a clip/spring simply holds the heat sink down at a certain pressure, which is fixed. This results in undue pressure on connectors (between the die and a circuit board) as well as on the die itself.

Third, mounting hardware such as ball grid array (BGA) spring clips (used on modules to provide actuation to small heat sinks and used in conjunction with high performance TIMs) have the drawbacks of reduction in heat sink performance (due to poor mating between the heat sink and the die); solder ball stress/integrity issues (due to undue pressure against the die by the BGA spring clips); the inability to support high loads (due to the limited strength of the springs in the BGA spring clips); and the inability to survive shock/vibe requirements (due to the limited resilience provided by BGA spring clips).

Furthermore, adhesive thermal interface materials (TIMs), when used alone to adhere a heat sink to a die are among the lowest performers for thermal conductivity since they are mainly composed of polymer adhesive. Furthermore, adhesive TIMs are also extremely difficult to rework or remove, since they are an adhesive (glue) that permanently bonds the heat sink to the die.

Other actuation hardware requires board space and sometimes holes in the board in order to have retention. This is the most undesirable option since board space near modules is at a premium and any hardware in these regions takes away from the capability and/or signal integrity of the whole system.

Figure 1:
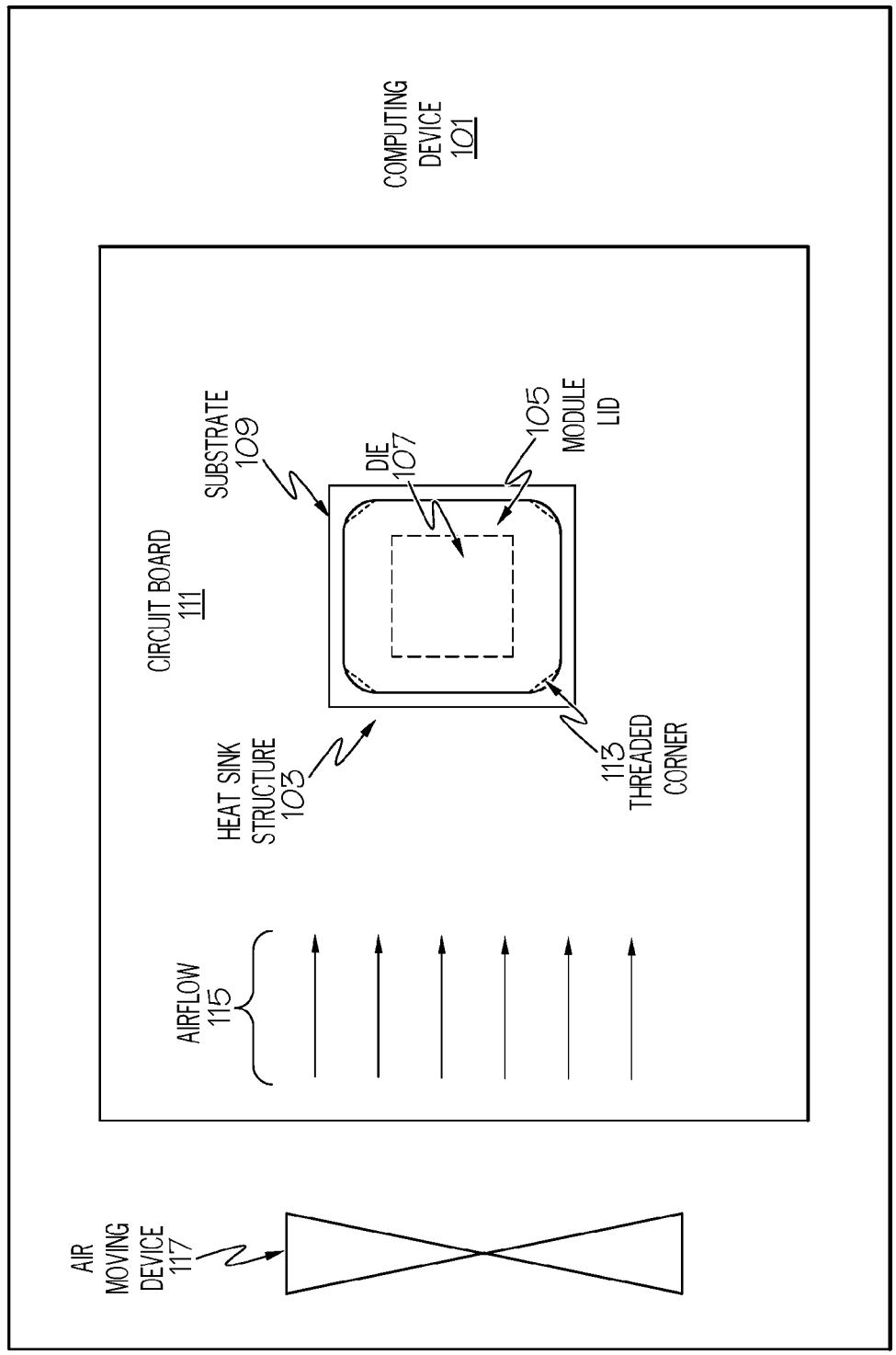
FIG. 1 depicts an exemplary computing device into which a novel heat sink structure is incorporated.

With reference now to the figures, and specifically to FIG. 1, an exemplary computing device 101 into which the presently-presented and novel heat sink structure 103 is incorporated is presented. Heat sink structure 103 includes a module lid 105, which is mounted atop a die 107 (e.g., an integrated circuit), which is mounted atop a substrate 109 (e.g., a glass epoxy that supports internal wires to external connectors), which is mounted on a circuit board 111 (e.g. a glass epoxy structure that supports various integrated circuits, power supplies, fans, input/output interfaces, etc.).

As shown in FIG. 1, in an embodiment of the present invention module lid 105 has a polygonal shape (e.g., a square) that has multiple threaded corners, such as threaded corner 113. When a heat sink (shown in FIGS. 2-3 but not FIG. 1) is fully engaged with the module lid 105, airflow 115 from an air moving device 117 (e.g., a cooling fan within a housing of computing device 101 and/or mounted on the circuit board 111 itself) flows parallel to (and thus unimpeded by) cooling vanes on the heat sink. Additional details of the heat sink structure 103 are shown below in FIGS. 2-3.

Figure 2:
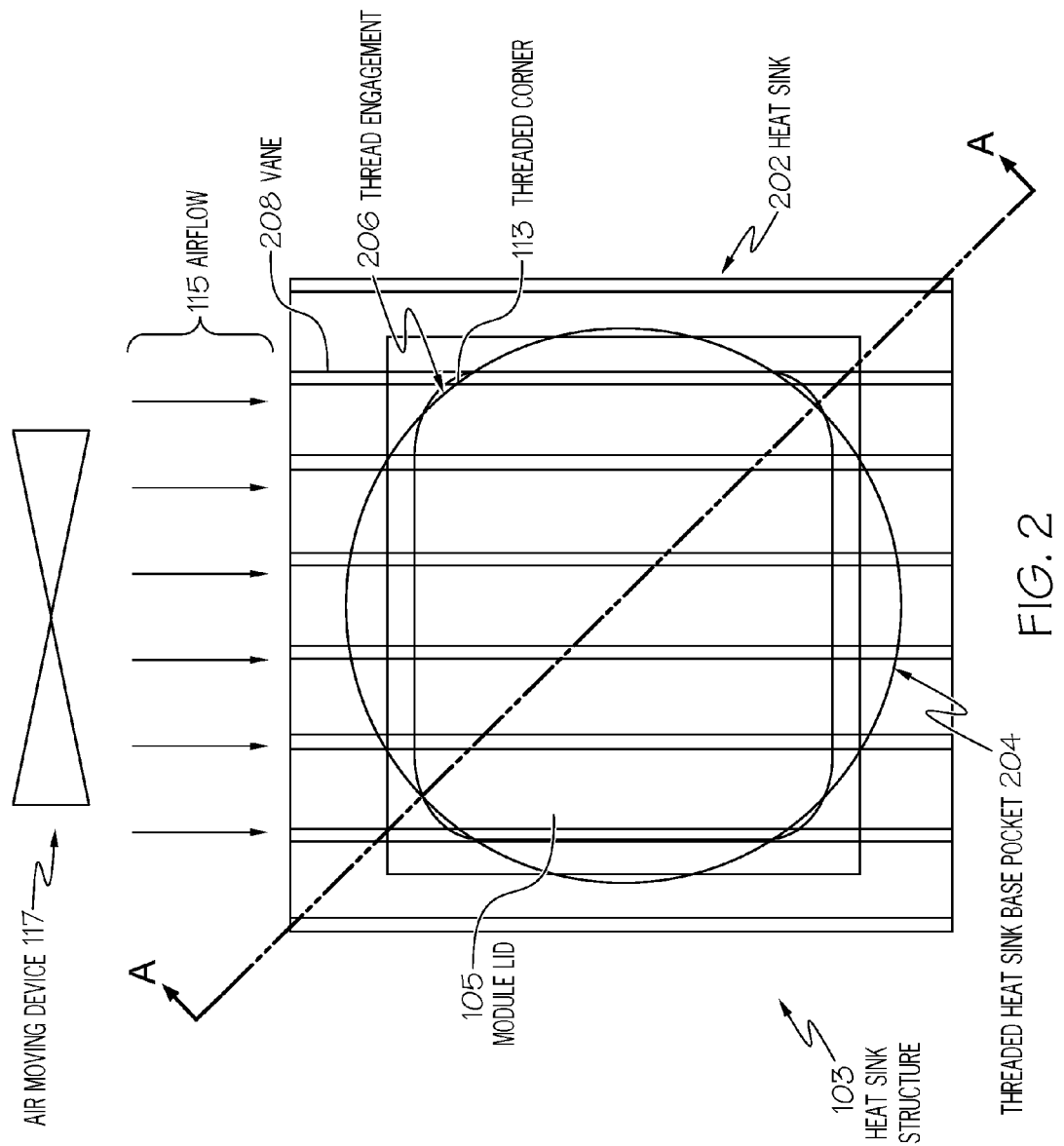
FIG. 2 illustrates a top view of the novel heat sink structure presented herein.

With reference now to FIG. 2, a top view of the novel heat sink structure 103 introduced in FIG. 1 is presented. As shown in FIG. 2, a heat sink 202 is mounted over the module lid 105. Heat sink 202 has a threaded heat sink base pocket 204, which is screwed onto the threaded corners (e.g., threaded corner 113) of module lid 105 to form multiple thread engagements (e.g., thread engagement 206). Thus, heat sink 202 is screwed down onto module lid 105 until 1) solid mechanical and thermal contact is established between heat sink 202 and module lid 105, and 2) the airflow 115 from air moving device 117 flows unobstructed across the vanes (e.g., vane 208) on heat sink 202.

Figure 3:
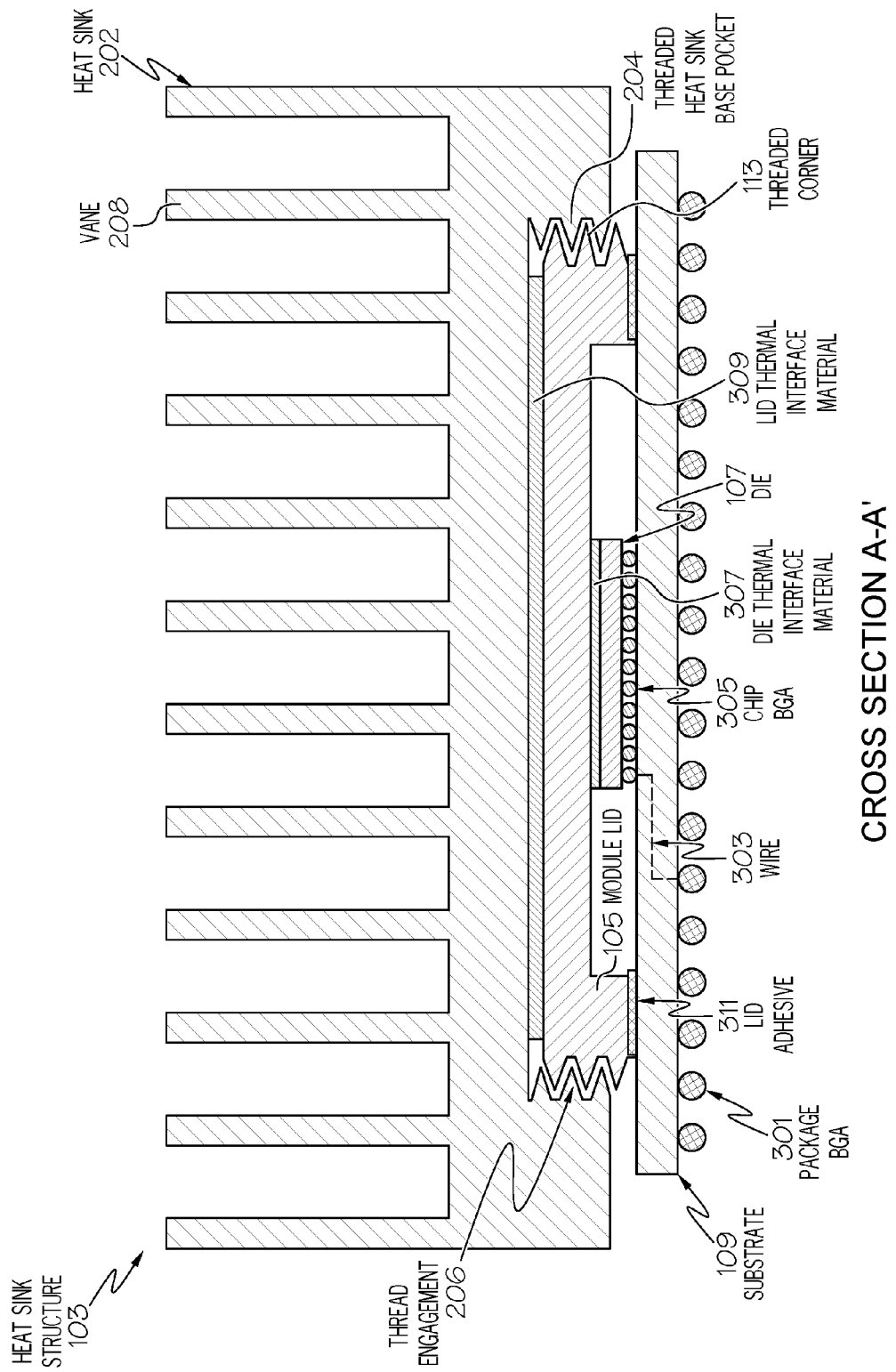
FIG. 3 depicts a cross-sectional view of the heat sink structure shown in FIG. 2.

With reference now to FIG. 3, a cross-sectional view of the heat sink structure 103 shown in FIG. 2 is presented.

As shown in FIG. 3, a package ball grid array (BGA) 301 provides electrical connections between a planar (i.e., a printed circuit board—not shown) and the die 107 using internal wiring, such as the depicted wire 303 that connects one of the solder balls from package BGA 301 to one or more of the solder balls in the chip BGA 305. The chip BGA 305 is connected to internal circuitry (not shown) within the die 107, which is thermally coupled by a die thermal interface material (TIM) 307 to the underside of the module lid 105. As depicted, module lid 105 is adhered to substrate 109 using a lid adhesive 311 (e.g., a heat resistant glue), thus providing a fixed combination of module lid 105, die 107, and substrate 109.

The present invention provides a novel and adjustable means for affixing the heat sink 202 to the module lid 105. That is, the heat sink 202 has a threaded heat sink base pocket 204, whose inner surfaces are threaded. These threaded inner surfaces from the threaded heat sink base pocket 204 screw onto the threaded corners (e.g., threaded corner 113) of the polygonal-shaped module lid 105 at areas such as the depicted thread engagement 206 area.

As a user screws the heat sink 202 down onto the module lid 105, the user is able to 1) selectively control the amount of pressure forced against the module lid 105; 2) evenly spread out the lid thermal interface material (TIM) 309 between the heat sink 202 and the module lid 105 by the rotational movement of the heat sink 202; and 3) align the orientation of the vanes (e.g., vane 208) such that airflow 115 from the air moving device 117 shown in FIGS. 1-2 flows between the vanes, thereby providing maximum heat removal.

Thus, as depicted and described herein, the corners of a lidded module are rounded and threaded such that a heat sink with a certain-depth threaded recess can be screwed on. Mounting a heat sink in this fashion prevents the need for board level mounting hardware and allows the use of a high quality thermal interface material. The threading is aligned such that at an optimal, nominal gap, the fins and heat sink orientation are properly aligned with the airflow direction. Given the planarity of lidded modules, this type of actuation has a beneficial effect on the thermal bond line directly over the hottest components, further improving thermal performance of the heat sink.

An additional benefit of the mounting scheme presented and described in the present disclosure and figures includes better electromagnetic interference (EMI) protection due to the intimate contact between the heat sink base and the module lid.

In an alternative embodiment of the present invention, a threaded ring is used on the previously described heat sink structure to provide a compliant surface for mounting a standard heat sink. This type of mounting allows a spring clip or other constant force mounting scheme without using board space or impacting signal integrity.

Having thus described embodiments of the present invention of the present application in detail and by reference to illustrative embodiments thereof, it will be apparent that modifications and variations are possible without departing from the scope of the present invention defined in the appended claims.

What is claimed is:

1. A method of affixing a heat sink to a module lid, the method comprising:
   mounting the module lid to a substrate by use of a lid adhesive, wherein the module lid has a threaded exterior portion, wherein the module lid has a polygonal shape that has rounded corners, and wherein the threaded exterior portion of the module lid is only at the rounded corners of the module lid;
   thermally interfacing the module lid to a die by use of a thermal interface material; and
   screwing the heat sink onto the module lid, wherein the heat sink comprises a threaded heat sink base pocket that mates with the threaded exterior portion of the module lid, and wherein the heat sink is screwed down onto the module lid until 1) a solid mechanical and thermal contact is established between the heat sink and the module lid, and 2) an airflow from an air moving device flows unobstructed across vanes on the heat sink.

2. The method of claim 1, wherein the airflow from the air moving device is parallel to vanes of the heat sink when a thread engagement between the heat sink and the module lid mechanically and thermally couples the heat sink to the module lid.

\* \* \* \* \*